United States Patent
Hong et al.

(10) Patent No.: US 11,749,751 B2
(45) Date of Patent: Sep. 5, 2023

(54) LATERAL DMOS WITH INTEGRATED SCHOTTKY DIODE

(71) Applicant: Chengdu Monolithic Power Systems Co., Ltd., Chengdu (CN)

(72) Inventors: Tao Hong, Chengdu (CN); Daping Fu, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 246 days.

(21) Appl. No.: 16/950,447

(22) Filed: Nov. 17, 2020

(65) Prior Publication Data
US 2021/0159330 A1 May 27, 2021

(30) Foreign Application Priority Data
Nov. 27, 2019 (CN) .......................... 201911182510.4

(51) Int. Cl.
*H01L 29/78* (2006.01)
*H01L 29/06* (2006.01)

(52) U.S. Cl.
CPC ........ *H01L 29/782* (2013.01); *H01L 29/0623* (2013.01); *H01L 29/0653* (2013.01)

(58) Field of Classification Search
CPC ........... H01L 29/66681; H01L 29/7816; H01L 29/782; H01L 29/7823
See application file for complete search history.

(56) References Cited

U.S. PATENT DOCUMENTS

| 2012/0175724 A1* | 7/2012 | Haynie | .................. | H01L 29/872 |
| | | | | 257/E29.338 |
| 2019/0181237 A1* | 6/2019 | Xia | ..................... | H01L 29/0653 |

* cited by examiner

*Primary Examiner* — Matthew C Landau
*Assistant Examiner* — Mark Hatzilambrou
(74) *Attorney, Agent, or Firm* — Perkins Coie LLP

(57) ABSTRACT

A lateral transistor having a well region, a body region, a source region, a drain region, a gate structure and a trenched Schottky barrier structure. The trenched Schottky barrier structure extended vertically from a top surface of the well region through the source region and the body region and penetrated into at least a portion of the well region to form a vertical Schottky contact.

18 Claims, 9 Drawing Sheets

LATERAL DMOS WITH INTEGRATED SCHOTTKY DIODE

CROSS-REFERENCE TO RELATED APPLICATION(S)

This application claims the benefit of CN application No. 201911182510.4 filed on Nov. 27, 2019 and incorporated herein by reference.

TECHNICAL FIELD

This disclosure relates generally to semiconductor devices, and particularly but not exclusively relates to lateral high voltage transistors.

BACKGROUND

Lateral double diffused metal oxide semiconductor field effect transistor ("LDMOS") is widely used in various power management integrated circuits. However, conventional LDMOS has a body diode needing reverse recovery when used as switching element, leading to higher power loss especially operating at higher switching frequency. It is desired in most integrated circuit applications that the LDMOS has reduced size while maintaining high reverse substrate injection rejection performance and low switching power loss.

SUMMARY

In accordance with an embodiment of the present invention, a lateral transistor is disclosed. The lateral DMOS may comprise: a semiconductor layer of a first conductivity type; a well region of a second conductivity type opposite to the first conductivity type formed in or on the semiconductor layer; a body region of the first conductivity type formed in the well region; a source region of the second conductivity type formed in the body region; a drain region of the second conductivity type formed in the well region and separated from the body region; a gate structure positioned atop a portion of the well region; and a trenched Schottky barrier structure extended vertically from a top surface of the well region through the source region and the body region and penetrated into at least a portion of the well region to form a vertical Schottky contact.

In accordance with an embodiment, the trenched Schottky barrier structure may comprise a metalization filler that fills a trench opened from the top surface of the well region and extended vertically through the source region and the body region and penetrated into the well region.

In accordance with an embodiment, the trenched Schottky barrier structure has a predetermined trench depth.

In accordance with an embodiment of the present invention, the lateral transistor may further comprise a body contact region of the first conductivity type, located in the body region and laterally distributed between the source region and the trenched Schottky barrier structure.

In accordance with an embodiment of the present invention, the trenched Schottky barrier structure may further extend vertically until it contacts the semiconductor layer or until it penetrates into a portion of the semiconductor layer.

In accordance with an embodiment of the present invention, the lateral transistor may further comprise a guard ring region of the first conductivity type. The guard ring region may be formed around a bottom of the trenched Schottky barrier structure, and surrounding or enveloping a bottom area of the trenched Schottky barrier structure so that an ohmic contact is formed between the bottom area of the trenched Schottky barrier structure and the guard ring region.

In accordance with an embodiment of the present invention, the guard ring region may have a guard ring doping concentration that is greater than a substrate doping concentration of the semiconductor layer.

In accordance with an embodiment of the present invention, the guard ring doping concentration may be higher than a body region doping concentration of the body region.

In accordance with an embodiment of the present invention, the lateral transistor may further comprise a buried layer, formed in the semiconductor layer, located below the well region. In an embodiment, the guard ring region may be in contact with the buried layer or at least partially surrounded/enveloped by the buried layer. In an alternative embodiment, the guard ring region may be omitted and the buried layer may envelope/surround the bottom area of the trenched Schottky barrier structure and be in contact with the bottom and a portion of sidewalls of the trenched Schottky barrier structure.

In accordance with an embodiment of the present invention, instead of being laterally distributed between the source region and the trenched Schottky barrier structure, the body contact region may be arranged alternately with the source region along a direction perpendicular with both the lateral direction and vertical direction.

In accordance with an embodiment of the present invention, instead of being laterally distributed between the source region and the trenched Schottky barrier structure, the body contact region may be positioned vertically below the source region.

In accordance with an embodiment of the present invention, the trenched Schottky barrier structure may comprise a first trenched portion and a second trenched portion, and wherein the second trenched portion is located below the first trenched portion and connected to the first trenched portion. In an embodiment, the first trenched portion may have a first trench depth that is greater than a source depth of the source region and smaller than a body region depth of the body region. In an embodiment, the first trenched portion may have a first trench width, and the second trenched portion may have a second trench width that is smaller than the first trench width. In an embodiment, the second trenched portion may have a second trench depth that determines a vertical contact depth of the vertical Schottky contact.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features. Likewise, the relative sizes of elements illustrated by the drawings may differ from the relative size depicted.

The use of the same reference label in different drawings indicates the same or like components or structures with substantially the same functions for the sake of simplicity.

DETAILED DESCRIPTION

Various embodiments of the present invention will now be described. In the following description, some specific details, such as example device structures, example manufacturing process and manufacturing steps, and example values for the process, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," "right," "in," "out," "front," "back," "up," "down," "top," "atop", "bottom," "over," "under," "overlying," "underlying," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner to establish an electrical relationship between the elements that are coupled. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1:
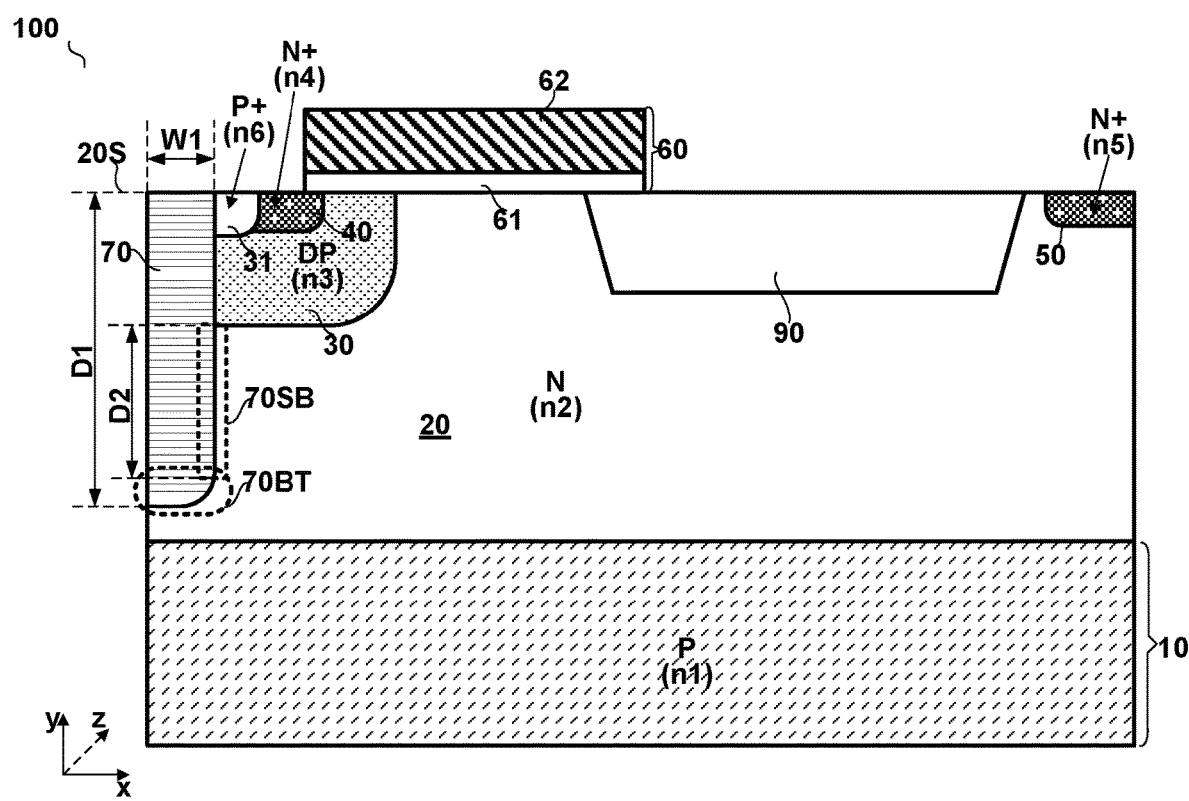
FIG. 1 illustrates a cross-sectional view of a lateral transistor 100 in accordance with an embodiment of the present invention.

FIG. 1 illustrates a cross-sectional view of a lateral transistor 100 in accordance with an embodiment of the present invention. The cross-section is illustrated out in a 3 dimensional coordinate system having the x axis, y axis and z axis perpendicular to one another, showing a portion cut from a plane parallel with the plane defined by the x axis and y axis. Throughout this disclosure, lateral refers to a direction parallel to the x-axis and width refers to a dimension measured in the x dimension while vertical refers to a direction parallel to the y-axis and depth or thickness refers to a dimension measured in the y dimension. The lateral transistor 100 may comprise a semiconductor layer 10 of a first conductivity type (e.g. P-type in FIG. 1) and having a substrate dopant concentration n1; a well region 20 of a second conductivity type (e.g. N-type in FIG. 1) opposite to the first conductivity type, formed in or atop the semiconductor layer 10 and having a well dopant concentration n2; a body region 30 of the first conductivity type (e.g. illustrated as a DP region in FIG. 1) formed in the well region 20 and having a body dopant concentration n3; a source region 40 of the second conductivity type (e.g. illustrated as an N$^+$ region in FIG. 1) formed in the body region 30 and having a source dopant concentration n4 that is higher than the well dopant concentration n2, for example the source dopant concentration n4 may be higher than $1*10^{19}$ cm$^{-3}$; a drain region 50 of the second conductivity type (e.g. illustrated as another N$^+$ region in FIG. 1) formed in the well region 20, separated from the body region 30 and having a drain dopant concentration n5 that is higher than the well dopant concentration n2; and a gate structure 60, positioned atop a portion of the well region 20 near the source region 40 side. It should be understood by those of ordinary skill in the art that "near the source region 40 side" is mentioned in comparison with the gate structure 60's lateral distance to the drain region 50 side. For instance, the gate structure 60 may have a greater lateral distance from the drain region 50 than from the source region 40. In an embodiment, the gate structure 60 may overlay a portion of the source region 40.

The lateral transistor 100 may further comprise a trenched Schottky barrier structure 70, extended vertically from a top surface 20S of the well region 20 through the source region 40 and the body region 30 and penetrated into at least a portion of the well region 20 that is below the body region 30. That is to say, the trenched Schottky barrier structure 70 has a portion vertically penetrated into at least a portion of the well region 20 that is below the body region 30. The trenched Schottky barrier structure 70 may be formed in a trench opened from the top surface 20S of the well region 20 and extended vertically through the source region 40 and the body region 30 and penetrated into the well region 20. In accordance with an embodiment, the trench may be formed by an etching process or a laser direct imaging and develop process or any other suitable process. The trench and therefore the trenched Schottky barrier structure 70 has sidewalls and a bottom and may have a predetermined trench width W1 and a predetermined trench depth D1. The trenched Schottky barrier structure 70 has a Schottky contact portion where sidewalls of the trenched Schottky barrier structure 70 interfacing or contacting with the well region 20. The Schottky contact portion interfaces or contacts with the well region 20 to form a vertical metal-semiconductor contact (i.e. Schottky contact) 70SB, also referred to as Schottky barrier 70SB or Schottky diode 70SB, illustrated out by the dashed frame 70SB in FIG. 1. That is to say, at the interface or contacting surface between the Schottky contact portion and the well region 20, a vertical metal-semiconductor contact 70SB (i.e. a Schottky contact 70SB, or a Schottky barrier 70SB or a Schottky diode 70SB) is formed. The vertical metal-semiconductor contact 70SB may have a vertical contact depth D2. It would be easily understood by one of ordinary skill in the art that the Schottky contact portion of the trenched Schottky barrier structure 70 can be referred to as having the vertical contact depth D2. The vertical contact depth D2 and thereby a contact area of the Schottky contact 70SB may be adjusted by modifying or adjusting the predetermined trench depth D1 of the trenched Schottky barrier structure 70 to meet various application requirements. In accordance with an embodiment, the trenched Schottky barrier structure 70 may comprise a metalization filler (also labeled with 70 for simplicity) that fills the trench. The metalization filler 70 may be formed of, for example, a metalized material from a metalized material group such as Tungsten (W), Titanium (Ti), Cobalt (Co), Nickel (Ni) and other metal, metallic compounds, alloy etc., or can be formed of a multi metallic layer containing two or more from the metalized material group. The metalization filler 70 (or the trenched Schottky barrier structure 70) may function as an anode of the Schottky barrier 70SB and the well region 20 may function as a cathode of the Schottky barrier 70SB.

The Schottky contact (or Schottky barrier) 70SB may be used as a Schottky diode coupled between the body region 30 and the drain region 50 of the lateral transistor 100. The Schottky barrier 70SB may have a forward conduction voltage drop Vfsb which is generally lower than a forward conduction voltage drop Vfbd of a body diode (formed between the body region 30 and the well region 20) of the lateral transistor 100, i.e. Vfsb<Vfsd. For instance, the forward conduction voltage drop Vfsb of the Schottky barrier 70SB may be of around 0.3V while the forward conduction voltage drop Vfbd of the body diode of the lateral transistor 100 may be of around 0.7V. Therefore, when the lateral transistor 100 in accordance with various embodiments of the present invention is used as power switch in a power converter for example, the Schottky barrier 70SB may advantageously help to reduce a conduction loss caused conventionally by the body diode, especially when the lateral transistor 100 is operated to switch at a higher switching frequency. In addition, the Schottky barrier 70SB may have lower reverse recovery charge Qrr in comparison with the body diode of the lateral transistor 100, and thus may help to provide a shorter reverse recovery time instead of conventionally needed by the body diode of the lateral transistor 100, and thereby reducing reverse recovery loss caused conventionally by the body diode.

In accordance with various embodiments of the present invention, the Schottky barrier (or Schottky diode) 70SB may be integrated with the lateral transistor 100 with the trenched Schottky barrier structure 70 formed and may be manufactured with compatible manufacturing processes for fabricating the lateral transistor 100. Since the trenched Schottky barrier structure 70 vertically penetrates into the well region 20 and forms the Schottky contact 70SB between the Schottky contact portion and the well region 20, the contact area of the Schottky contact (or Schottky barrier or Schottky diode) 70SB is mainly determined by the predetermined trench depth D1 of the trenched Schottky barrier structure 70. Therefore, the predetermined trench width W1 of the trenched Schottky barrier structure 70 may be reduced to a minimum lateral size that can be fabricated by the manufacturing process. Comparing with the solution of forming a lateral Schottky contact, for instance described in U.S. Pat. No. 8,686,502B2, by forming a metallization layer (e.g. a cobalt silicide layer) on a surface of the N type epitaxial layer 900 (FIG. 9 and FIG. 10 of U.S. Pat. No. 8,686,502B2), lateral transistor 100 integrating the trenched Schottky barrier structure 70 according to various embodiments of the present invention may have reduced lateral size, which should have great advantages in current integrated circuit applications and can better meet the requirements of today's integrated circuit applications to lateral transistors such as to have smaller size and good reverse leakage/reverse substrate injection suppression capabilities.

In accordance with an embodiment of the present invention, the lateral transistor 100 may further include a body contact region 31 located in the body region 30 and laterally distributed between the source region 40 and the trenched Schottky barrier structure 70, referring to FIG. 1. The body contact region 31 may have the first conductivity type and have a body contact region doping concentration n6. The body contact region doping concentration n6 is higher than the body region doping concentration n3 (i.e., n6>n3, for example, n6 may be higher than $1 \times 10^{19}$ cm$^{-3}$). In FIG. 1, the body contact region 31 is exemplarily illustrated and represented by the P+ area beside the source region 40. The body contact region 31 is beneficial to improve the electrical contact performance from the source region 40 to the well region 20, and helps increase the safe operating area (SOA) of the lateral transistor 100.

Figure 2:
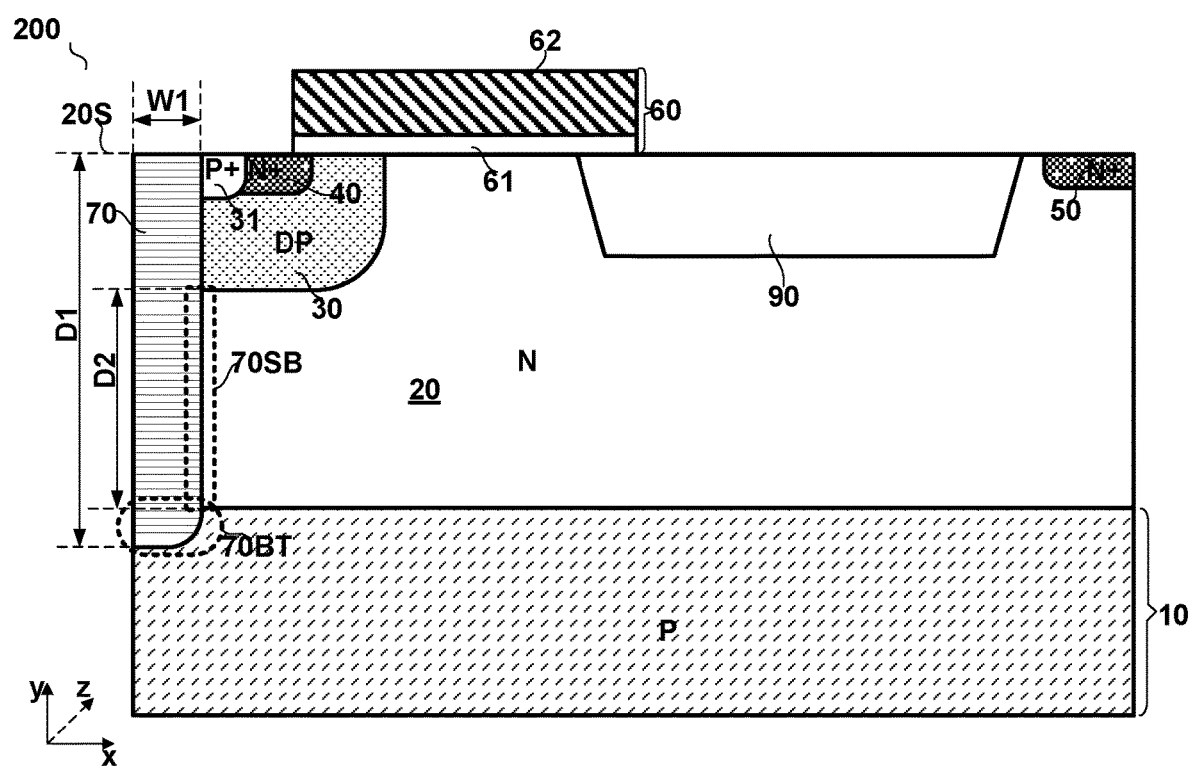
FIG. 2 illustrates a cross-sectional view of a lateral transistor 200 in accordance with an alternative embodiment of the present invention.

In accordance with an embodiment of the present invention, as shown in FIG. 2, the trenched Schottky barrier structure 70 of the lateral transistor 200 may extend vertically until it contacts the semiconductor layer 10 or extend into a portion of the semiconductor layer 10 to make the vertical contact depth D2 and thereby the Schottky contact area of the Schottky contact 70SB maximized. In addition, in the embodiment illustrated in FIG. 1, the bottom area (the portion indicated by the dashed frame 70BT in FIG. 1) of the trenched Schottky barrier structure 70 has corners, so it is not desirable that Schottky contact be formed between the bottom area 70BT and the well region 20. In the embodiment shown in FIG. 2, the bottom area 70BT of the trenched Schottky barrier structure 70 is in contact with the semiconductor layer 10 or extends into a portion of the semiconductor layer 10, which may help to avoid the formation of Schottky contact between the bottom area 70BT of the trenched Schottky barrier structure 70 and the well region 20.

Figure 3:
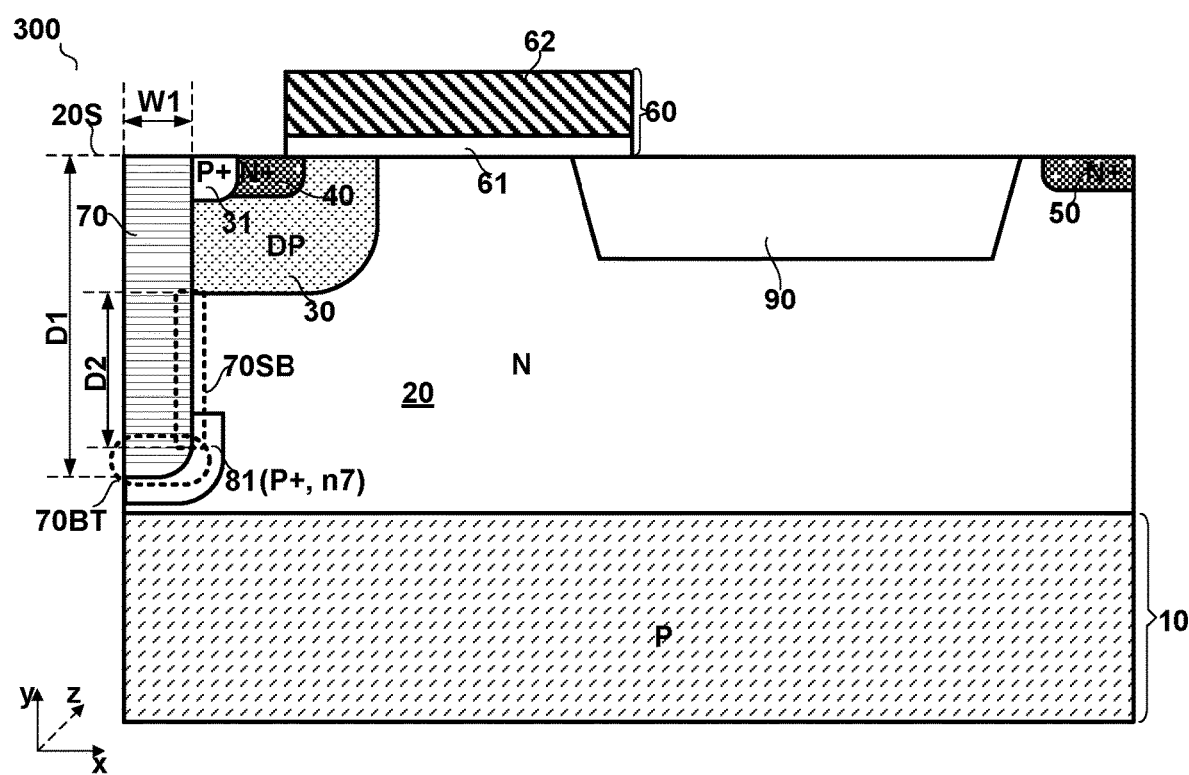
FIG. 3 illustrates a cross-sectional view of a lateral transistor 300 in accordance with an alternative embodiment of the present invention.

In accordance with an embodiment of the present invention, as shown in FIG. 3, compared with the lateral transistors 100 and 200, the lateral transistor 300 may optionally further comprise a guard ring region 81 having the first conductivity type. The guard ring region 81 may have a guard ring doping concentration n7 that is greater than the substrate doping concentration n1 of the semiconductor layer 10 (i.e., n7>n1, for example, n1 may be between $1 \times 10^{14}$ cm$^{-3}$ and $1 \times 10^{15}$ cm$^{-3}$, n7 may be higher than $1 \times 10^{19}$ cm$^{-3}$). The guard ring doping concentration n7 may also be greater than the body region doping concentration n3 of the body region (i.e., n7>n3). The guard ring region 81 may be formed around the bottom of the trenched Schottky barrier structure 70, and envelopes the bottom area 70BT of the trenched Schottky barrier structure 70 so that an ohmic contact is formed between the bottom area 70BT of the trenched Schottky barrier structure 70 and the guard ring region 81. In addition, the guard ring region 81 may be used as a guard ring to the bottom area 70BT of the trenched Schottky barrier structure 70 to reduce a reverse leakage current of the Schottky barrier (Schottky diode) 70SB, and to reduce an electric field intensity sustained by the bottom area 70BT of the trenched Schottky barrier structure 70.

Figure 4:
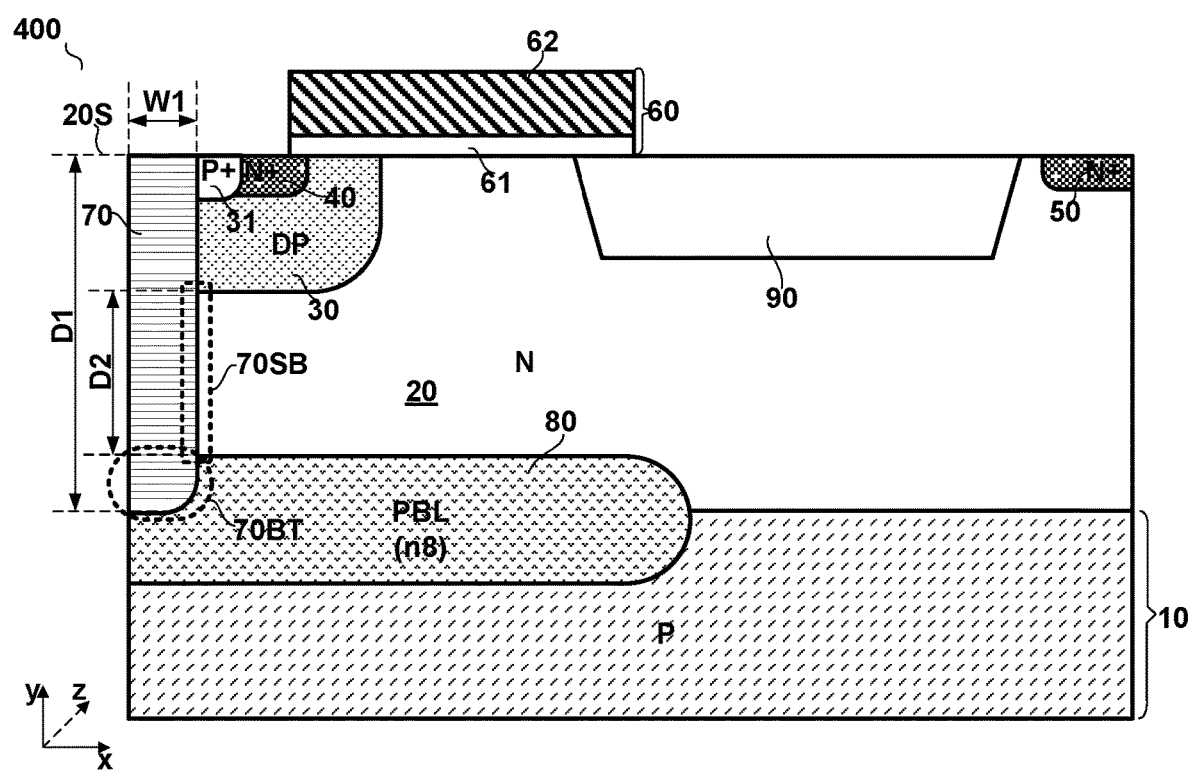
FIG. 4 illustrates a cross-sectional view of a lateral transistor 400 in accordance with an alternative embodiment of the present invention.

In accordance with an embodiment of the present invention, referring to FIG. 4, compared with the lateral transistors 100 and 200, the lateral transistor 400 may optionally further include a buried layer 80, formed in the semiconductor layer 10, located below the well region 20, and enveloping/surrounding the bottom area 70BT of the trenched Schottky barrier structure 70 and being in contact with the bottom and a part of the sidewall of the trenched Schottky barrier structure 70. The buried layer 80 may have the first conductivity type (for example, P type in the example of FIG. 4 and represented by PBL region), and a buried layer doping concentration n8, which is greater than the substrate doping concentration n1 of the semiconductor layer 10 (i.e., n8>n1, for example, n1 may be between $1\times10^{14}$ cm$^{-3}$ and $1\times10^{15}$ cm$^{-3}$, and n8 may be between $1\times10^{16}$ cm$^{-3}$ and $1\times10^{17}$ cm$^{-3}$). On the one hand, the buried layer 80 may be used as a guard ring of the trenched Schottky barrier structure 70. When the lateral transistor 400 is turned off and a higher drain-source voltage (voltage drop from drain region 50 to source region 40) is applied, the buried layer 80 may help to reduce the electric field strength of the Schottky barrier (Schottky diode) 70SB and reduce the reverse leakage current of the Schottky barrier (Schottky diode) 70SB. On the other hand, the buried layer 80 may be regarded as a buried RESURF (reduced surface field) layer, which helps to further increase the breakdown voltage of the lateral transistor 400. At the same time, the well region 20 above the buried layer 80 may have a higher doping concentration than it would be without the buried layer 80, thereby further improving the breakdown voltage of the lateral transistor 400. In this case, the on-resistance of the lateral transistor 400 can be further effectively reduced. In one embodiment, as shown in FIG. 4, the buried layer 80 may extend laterally below the gate structure 60 to better play the role of RESURF. In the example of FIG. 1, the buried layer 80 may partially diffused vertically upward into the well region 20 to ensure that in the embodiment where the trenched Schottky barrier structure 70 does not extend into the semiconductor layer 10, the buried layer 80 can still envelopes its bottom area 70BT. In one embodiment, the buried layer 80 may further extend laterally below the body region 30. In one embodiment, the buried layer 80 may further extend to laterally across the entire lower portion of the well region 20.

Figure 5:
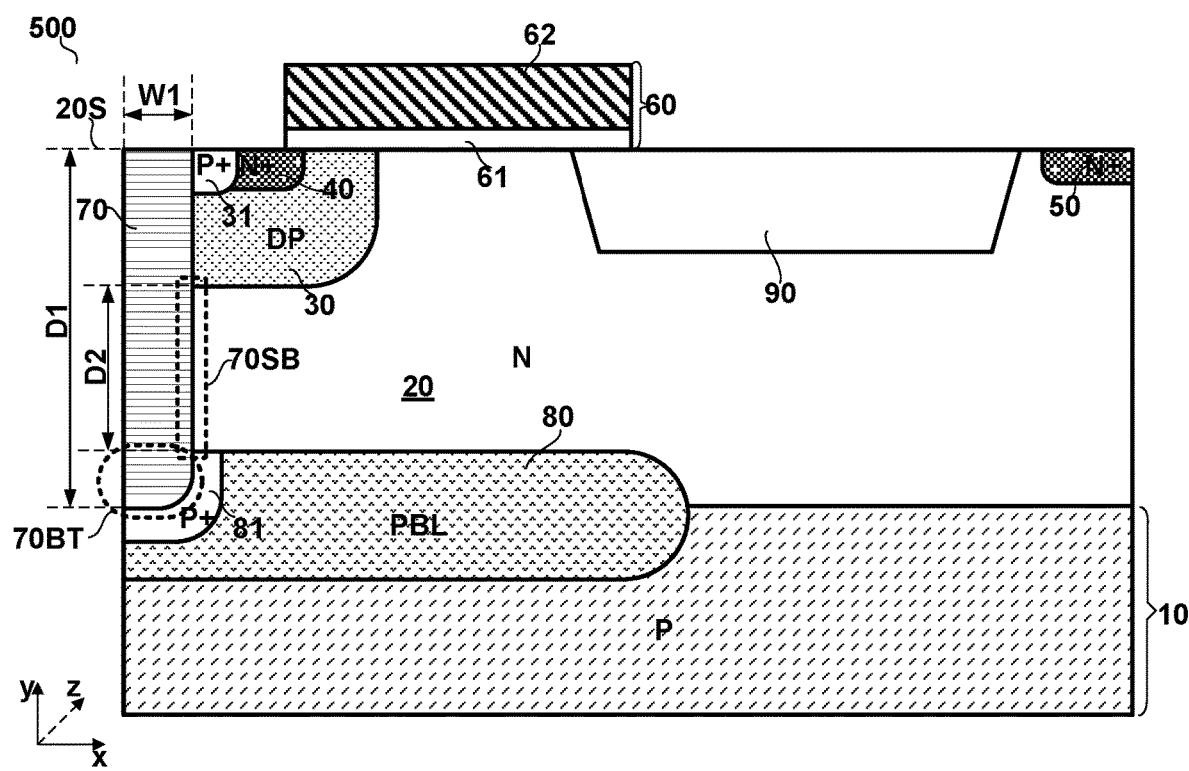
FIG. 5 illustrates a cross-sectional view of a lateral transistor 500 in accordance with an alternative embodiment of the present invention.

In accordance with an embodiment of the present invention, referring to FIG. 5, the lateral transistor 500 may optionally comprise both the guard ring region 81 and the buried layer 80, and the guard region 81 is formed around the bottom of the trenched Schottky barrier structure 70, surrounding/enveloping the bottom area 70BT of the trenched Schottky barrier structure 70 so that an ohmic contact is formed between the guard ring region 81 and the bottom area 70BT of the trenched Schottky barrier structure 70. The guard ring region 81 may be in contact with the buried layer 80, or may be at least partially surrounded/enveloped by the buried layer 80, or may be entirely enveloped by the buried layer 80 as shown in FIG. 5.

Figure 6A:
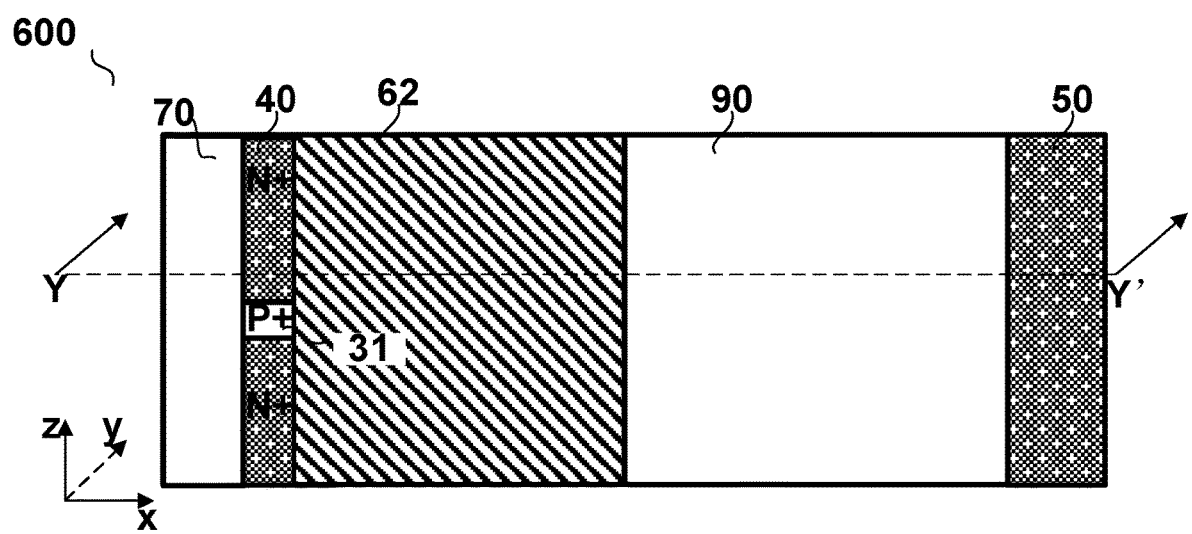
FIGS. 6A and 6B illustrates a top plan view and a cross-sectional view of a lateral transistor 600 in accordance with an alternative embodiment of the present invention.
Figure 6B:
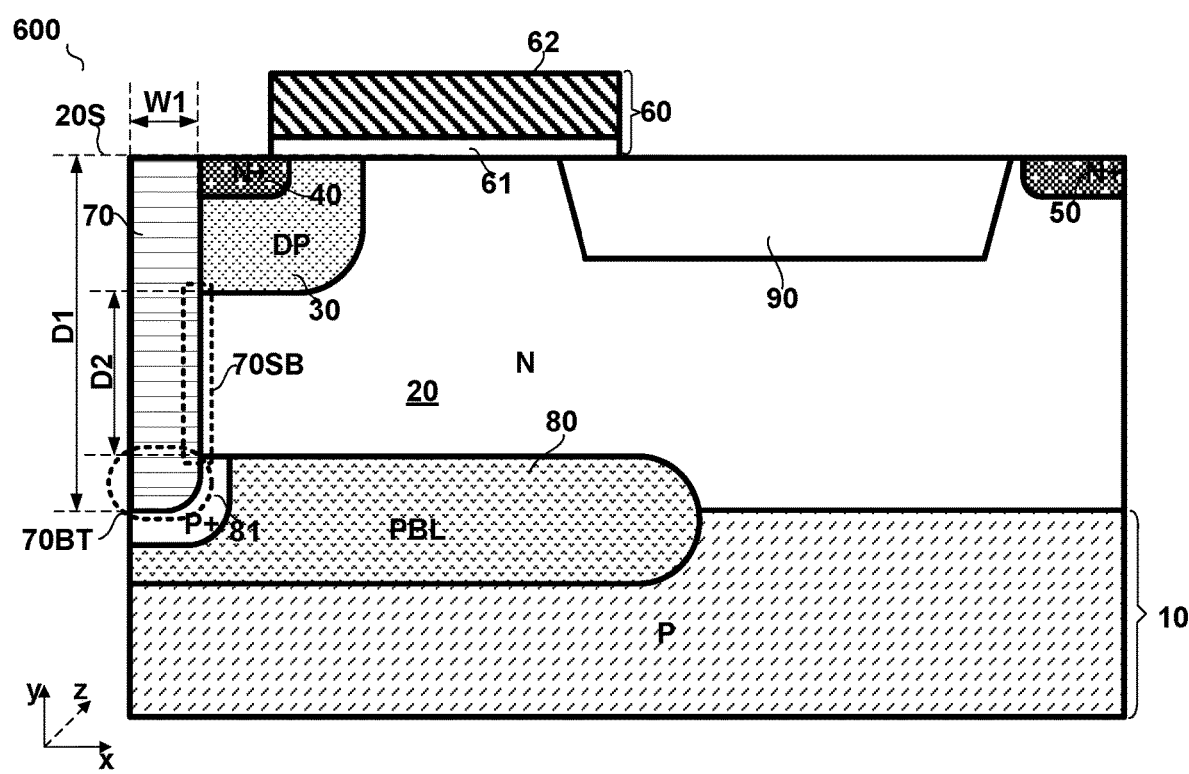

FIG. 6A and FIG. 6B illustrate a portion of a lateral transistor 600 according to an alternative embodiment of the present invention. FIG. 6A shows a top plan view of a portion of the lateral transistor 600, which can be understood as a schematic cross-sectional view obtained by cutting a portion of the lateral transistor 600 with a cut plane parallel to the x-axis and the z-axis. FIG. 6B shows a corresponding longitudinal cross-sectional view obtained by cutting the lateral transistor 600 shown in FIG. 6A longitudinally (along the y axis) with the Y-Y' cutting line. The lateral transistor 600 shown in the embodiments of FIGS. 6A and 6B is different from the lateral transistors 100-500 shown in the embodiments of FIGS. 1 to 5 in that its body contact region 31 is not laterally (in the x-axis direction)_distributed between the source region 40 and the trenched Schottky barrier structure 70 but are arranged alternately with the source region 40 along the z-axis direction (it is easier to understand from the plan view shown in FIG. 6A). That is to say, along the z-axis direction (the direction perpendicular with both the x-axis/lateral direction and y-axis/vertical direction), the body contact region 31 and the source region 40 are arranged in an alternating or interlacing pattern. The body contact region 31 is in contact with both the source region 40 and the trenched Schottky barrier structure 70. In this way, the body contact region 31 no longer occupies a size along the x-axis direction, which helps to further reduce the lateral size of the lateral transistor 600.

Figure 7:
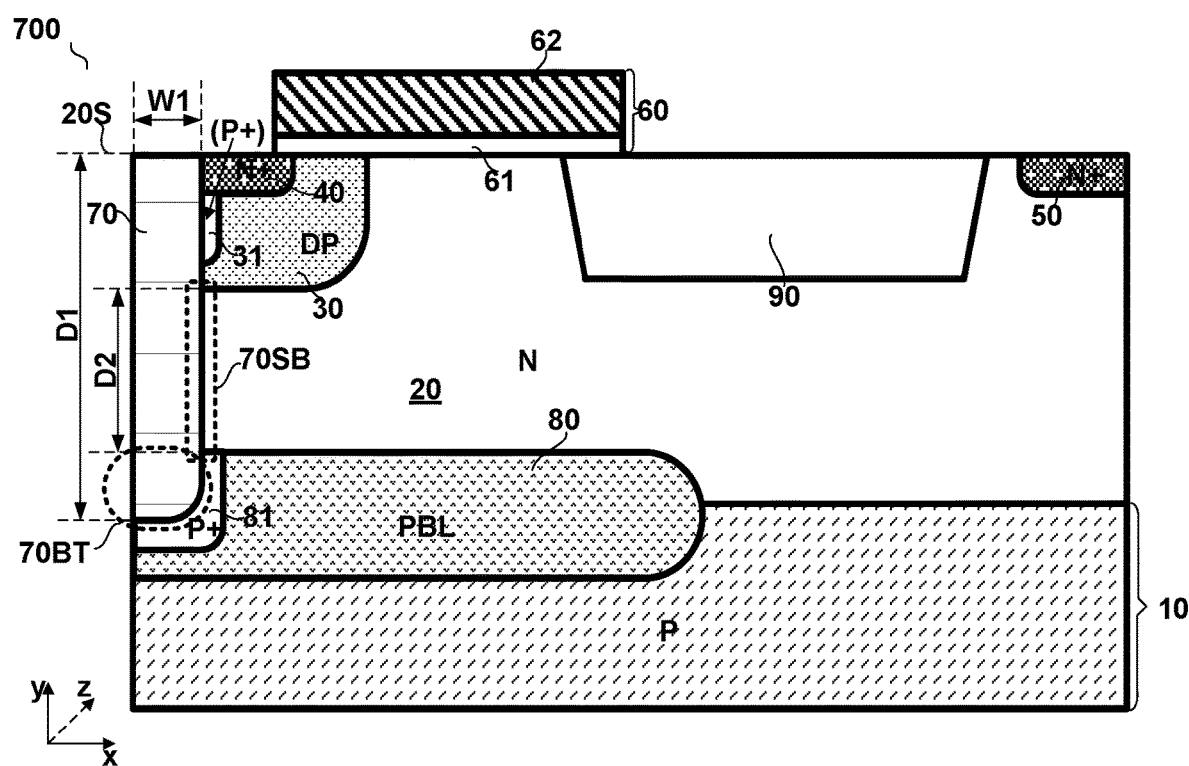
FIG. 7 illustrates a cross-sectional view of a lateral transistor 700 in accordance with an alternative embodiment of the present invention.

FIG. 7 shows a schematic cross-sectional view of a portion of a lateral transistor 700 according to an alternative embodiment of the present invention. The lateral transistor 700 illustrated in the embodiment of FIG. 7 is different from the lateral transistors 100-600 shown in the embodiments of FIGS. 1 to 6B in that the body contact region 31 is neither laterally distributed between the source region 40 and the trenched Schottky barrier structure 70, nor arranged alternately with the source region 40 along the z-axis direction, but is located vertically/longitudinally (along the y-axis direction) below the source region 40 and is in contact with both the source region 40 and the trenched Schottky barrier structure 70. In this way, on the one hand, the body contact region 31 no longer occupies the size along the x-axis direction, which helps to further reduce the lateral size of the lateral transistor 700. On the other hand, the body contact region 31 located longitudinally below the source region 40 may help to improve the ohmic contact between the body region 30 and the trenched Schottky barrier structure 70, and reduce a base resistance of a parasitic bipolar transistor (BJT) formed by the source region 40, the body region 30 and the well region 20, thereby increasing a turn-on current of the parasitic BJT to suppress turn-on of the parasitic BJT.

Figure 8:
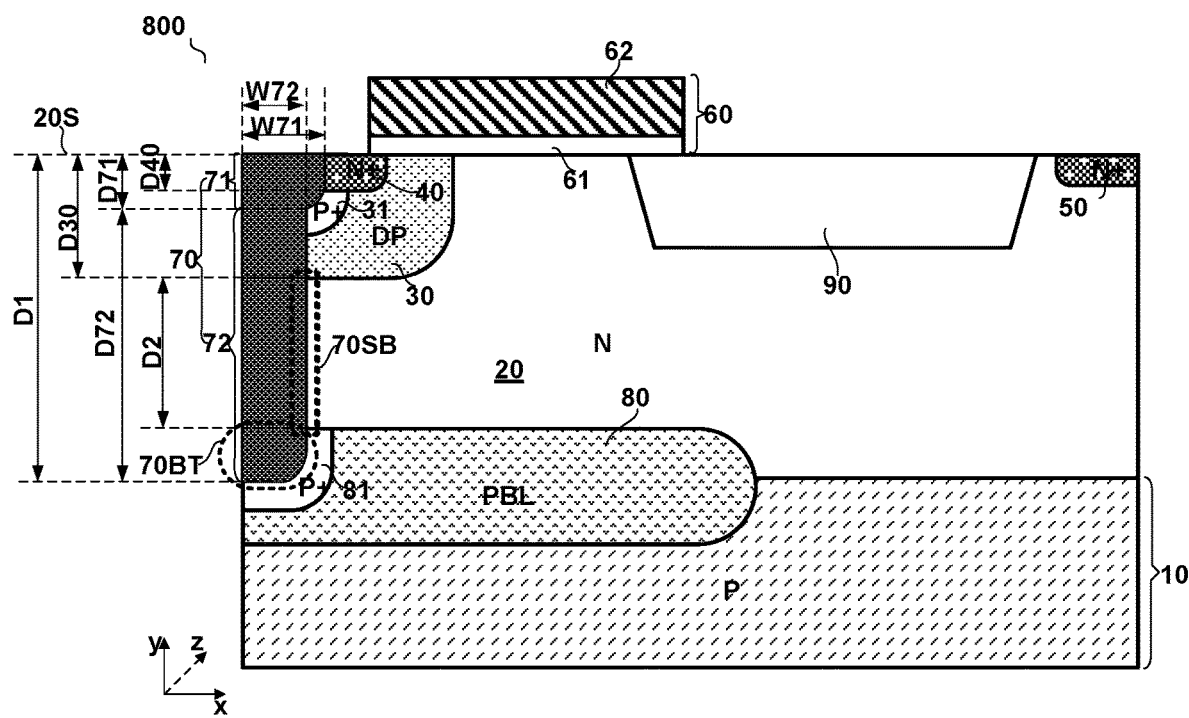
FIG. 8 illustrates a cross-sectional view of a lateral transistor 800 in accordance with an alternative embodiment of the present invention.

FIG. 8 shows a schematic cross-sectional view of a portion of a lateral transistor 800 according to an alternative embodiment of the present invention. Compared with the lateral transistor 700 shown in the embodiment of FIG. 7, in the lateral transistor 800 shown in the embodiment of FIG. 8, the trenched Schottky barrier structure 70 may comprise a first trenched portion 71 and a second trenched portion 72. The second trenched portion 72 is located below the first trenched portion 71 and connected to the first trenched portion 71. The first trenched portion 71 has a first trench depth D71 and a first trench width W71, and the first trench depth D71 is greater than a source depth D40 of the source region 40 and is smaller than a body region depth D30 of the body region 30. The source depth D40 refers to the vertical depth of the source region 40 vertically diffused from the upper surface 20S of the well region 20 into the well region 20. The body region depth D30 refers to the vertical depth of the body region 30 vertically diffused from the upper surface 20S of the well region 20 into the well region 20. The second trenched portion 72 has a second trench depth D72 and a second trench width W72. The second trench width W72 is smaller than the first trench width W71. The second trench depth D72 and the first trench depth D71 jointly determine the trench depth D1 of the trenched Schottky barrier structure 70, and the second trench depth D72 determines the vertical contact depth D2 of the Schottky contact 70SB (or the contact area of the Schottky barrier/Schottky diode 70SB) of the trenched Schottky barrier structure 70. In an exemplary embodiment, the body region depth D30 may be in the range of 0.3 μm to 1.5 μm, the source depth D40 may be in the range of 0.1 μm to 1.2 μm, and the first trench depth D71 may be in the range of 0.2 μm to 0.8 μm, the trench depth D1 of the trenched Schottky barrier structure 70 may be in the range of 0.5 μm to 8 μm or in the range of 2 μm to 8 μm. Those skilled in the art should understand that these depth ranges are merely examples to help understand the embodiments of the present invention, and are not intended to be limiting.

Embodiments of the lateral transistors 100-800 shown in FIG. 1 to FIG. 8 are only exemplary, and are not used to limit the present invention. Those skilled in the art should understand that the semiconductor layer 10 having the first conductivity type may be provided or formed on other layers (not shown in FIG. 1) that are compatible with the features of the lateral transistor 100 and the manufacturing process thereof according to the various embodiments of the present disclosure. For example, in an embodiment, the semiconductor layer 10 may be provided and formed on a semiconductor substrate having the first conductivity type. In another embodiment, the semiconductor layer 10 may be provided and formed on an epitaxial layer of the first conductivity type which may be formed on a semiconductor substrate having the first conductivity type. In still another embodiment, the semiconductor layer 10 may be provided and formed on a silicon oxide (SOI) layer that is formed on a semiconductor substrate of the first conductivity type. Embodiments according to the present invention tend to cover all equivalent implementations and/or modified implementations that include the semiconductor layer 10 and have a lateral transistor 100 formed thereon.

According to an embodiment of the present disclosure, as shown in FIGS. 1 to 8, the lateral transistors 100-800 may further optionally include a field dielectric layer 90, which may be formed (for example, can be made as a shallow trench type field dielectric layer) in or (for example, can be made as a traditional thick field oxide layer) atop a portion of the well region 20, which portion is between the gate structure 60 and the drain region 50.

Those skilled in the art should understand that the lateral transistor 100 according to each embodiment of the present disclosure may selectively include both the buried layer 80 and the guard ring region 81, or either one of them or none of them according to practical application requirements. Those skilled in the art should also understand that the lateral transistor according to the various embodiments of the present disclosure may optionally have the trenched Schottky barrier structure 70 vertically extended into a portion of the well region 20, or further extended to contact with the semiconductor layer 10 or into a portion of the semiconductor layer 10 according to practical application requirements. Those skilled in the art should also understand that the lateral transistor according to the various embodiments of the present disclosure may also optionally not include the field dielectric layer 90 according to practical application requirements, for example, the lateral transistor 100 may be used for medium and low voltage (For example, less than 30V) applications. These structural choices, combinations or simple changes made based on the various embodiments of the present disclosure fall within the scope of the present invention, no matter whether these modified structures are shown in the drawings of the present disclosure.

Although lateral transistor is illustrated and explained based on an N channel lateral DMOS according to various embodiments of the present invention, this is not intended to be limiting. Persons of ordinary skill in the art will understand that the processes, structures and principles taught herein may apply to other types of semiconductor devices such as a P channel lateral DMOS or any other suitable semiconductor structures/devices having the trenched Schottky barrier structure 70.

From the foregoing, it will be appreciated that specific embodiments of the present invention have been described herein for purposes of illustration, but that various modifications may be made without deviating from the invention. Many of the elements of one embodiment may be combined with other embodiments in addition to or in lieu of the elements of the other embodiments. Accordingly, the present invention is not limited except as by the appended claims.

We claim:

1. A lateral transistor, comprising:
   a semiconductor layer of a first conductivity type;
   a well region of a second conductivity type opposite to the first conductivity type formed in or on the semiconductor layer;
   a body region of the first conductivity type formed in the well region;
   a source region of the second conductivity type formed in the body region;
   a drain region of the second conductivity type formed in the well region and separated from the body region;
   a gate structure positioned atop a portion of the well region; and
   a trenched Schottky barrier structure extended vertically from a top surface of the well region through the source region and the body region and penetrated into at least a portion of the well region to form a vertical Schottky contact, wherein the trenched Schottky barrier structure further extends vertically until it contacts the semiconductor layer or until it penetrates into a portion of the semiconductor layer.

2. The lateral transistor of claim 1, wherein the trenched Schottky barrier structure has a predetermined trench depth.

3. The lateral transistor of claim 1, further comprising a body contact region of the first conductivity type, located in the body region and laterally distributed between the source region and the trenched Schottky barrier structure.

4. The lateral transistor of claim 1, further comprising:
   a guard ring region of the first conductivity type, formed around a bottom of the trenched Schottky barrier structure, and surrounding or enveloping a bottom area of the trenched Schottky barrier structure so that an ohmic contact is formed between the bottom area of the trenched Schottky barrier structure and the guard ring region.

5. The lateral transistor of claim 4, wherein the guard ring region has a guard ring doping concentration that is greater than a substrate doping concentration of the semiconductor layer.

6. The lateral transistor of claim 5, wherein the guard ring doping concentration is higher than a body region doping concentration of the body region.

7. The lateral transistor of claim 4, further comprising:
   a buried layer, formed in the semiconductor layer, located below the well region, wherein the guard ring region is in contact with the buried layer or at least partially surrounded/enveloped by the buried layer.

8. The lateral transistor of claim 1, further comprising:
   a buried layer, formed in the semiconductor layer, located below the well region, and enveloping/surrounding the a bottom area of the trenched Schottky barrier structure and being in contact with the bottom area and a portion of sidewalls of the trenched Schottky barrier structure.

9. The lateral transistor of claim 1, further comprising a body contact region, located in the body region, and arranged alternately with the source region along a direction perpendicular with both the lateral direction and vertical direction.

10. The lateral transistor of claim 9, wherein the body contact region is in contact with both the source region and the trenched Schottky barrier structure.

11. The lateral transistor of claim 1, further comprising a body contact region, located in the body region and positioned vertically below the source region.

12. The lateral transistor of claim 11, wherein the body contact region is in contact with both the source region and the trenched Schottky barrier structure.

13. The lateral transistor of claim 11, wherein the trenched Schottky barrier structure comprises a first trenched portion and a second trenched portion, and wherein the second trenched portion is located below the first trenched portion and connected to the first trenched portion.

14. The lateral transistor of claim 13, wherein the first trenched portion has a first trench depth that is greater than a source depth of the source region and smaller than a body region depth of the body region.

15. The lateral transistor of claim 13, wherein the first trenched portion has a first trench width, and wherein the second trenched portion has a second trench width that is smaller than the first trench width.

16. The lateral transistor of claim 13, wherein the second trenched portion has a second trench depth that determines a vertical contact depth of the vertical Schottky contact.

17. The lateral transistor of claim 1, further comprising.
a field dielectric layer, formed in or atop a portion of the well region, which portion is between the gate structure and the drain region.

18. The lateral transistor of claim 1, wherein the trenched Schottky barrier structure comprises a metallization filler that fills a trench opened from the top surface of the well region and extended vertically through the source region and the body region and penetrated into the well region.

* * * * *